(12) United States Patent
Endou et al.

(10) Patent No.: US 12,143,095 B2
(45) Date of Patent: Nov. 12, 2024

(54) RESONANCE DEVICE AND MANUFACTURING METHOD

(71) Applicant: Murata Manufacturing Co., Ltd., Nagaokakyo (JP)

(72) Inventors: Fumiya Endou, Nagaokakyo (JP); Masakazu Fukumitsu, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 18/350,987

(22) Filed: Jul. 12, 2023

(65) Prior Publication Data

US 2023/0353122 A1 Nov. 2, 2023

Related U.S. Application Data

(63) Continuation of application No. PCT/JP2021/036385, filed on Oct. 1, 2021.

(30) Foreign Application Priority Data

Jan. 26, 2021 (JP) .................................. 2021-010541

(51) Int. Cl.
*H03H 9/24* (2006.01)
*H03H 3/02* (2006.01)
(Continued)

(52) U.S. Cl.
CPC ............ *H03H 9/2468* (2013.01); *H03H 3/02* (2013.01); *H03H 9/1057* (2013.01); *H03H 9/125* (2013.01); *H03H 9/17* (2013.01)

(58) Field of Classification Search
CPC .... H03H 9/2468; H03H 9/1027; H03H 9/125; H03H 9/17; H03H 9/02448;
(Continued)

(56) References Cited

U.S. PATENT DOCUMENTS

| 2008/0034801 A1 | 2/2008 | Canham et al. |
| 2015/0188515 A1* | 7/2015 | Yamada ............. H03H 9/02102 |
| | | 331/156 |

(Continued)

FOREIGN PATENT DOCUMENTS

| JP | 2001194201 A | 7/2001 |
| JP | 2008266876 A | 11/2008 |

(Continued)

OTHER PUBLICATIONS

International Search Report in PCT/JP2021/036385, mailed Dec. 21, 2021, 5 pages.

*Primary Examiner* — Jeffrey M Shin
(74) *Attorney, Agent, or Firm* — ArentFox Schiff LLP

(57) ABSTRACT

A method of manufacturing a resonance device includes preparing a resonance device and adjusting a frequency of the resonator. The resonance device includes a lower lid, an upper lid joined to the lower lid, and a resonator with vibration arms that vibrate in bending vibration in an interior space between the lower and upper lids. The adjusting of the frequency of the resonator includes vibrating the vibration arms in bending vibration and thereby causing respective ends of the arms to strike the lower lid at an impact speed of $3.5 \times 10^3$ μm/sec or more. The ends of the vibration arms are made of silicon oxide, and the lower lid is made of silicon.

20 Claims, 9 Drawing Sheets

(51) Int. Cl.
*H03H 9/10* (2006.01)
*H03H 9/125* (2006.01)
*H03H 9/17* (2006.01)

(58) Field of Classification Search
CPC ...... H03H 9/1035; H03H 9/2489; H03H 3/02; H03H 3/0077; B81B 3/0075; B81B 2201/0271
See application file for complete search history.

(56) References Cited

U.S. PATENT DOCUMENTS

2019/0089321 A1* 3/2019 Morinaga ............ H03H 9/1014
2021/0159884 A1 5/2021 Goto et al.

FOREIGN PATENT DOCUMENTS

| JP | 2009290778 A | 12/2009 |
| WO | 2017212677 A1 | 12/2017 |
| WO | 2020039627 A1 | 2/2020 |

* cited by examiner 12,143,095 B2

RESONANCE DEVICE AND MANUFACTURING METHOD

CROSS REFERENCE TO RELATED APPLICATIONS

This application is a continuation of International Application No. PCT/JP2021/036385, filed Oct. 1, 2021, which claims priority to Japanese Patent Application No. 2021-010541, filed Jan. 26, 2021, the entire contents of each of which are hereby incorporated by reference in their entirety.

TECHNICAL FIELD

The present invention relates to a resonance device and a method of manufacturing the resonance device.

BACKGROUND

Resonance devices are currently used, for example, as timing devices, sensors, or oscillators in various electronic devices, such as mobile communication terminals, communication base stations, and home appliances. A known type of the resonance device is a so-called MEMS (micro-electro-mechanical systems) resonance device that includes a lower lid, an upper lid, and a resonator. The lower lid and the upper lid form an interior space therebetween, and the resonator includes vibration arms held so as to be able to vibrate in the interior space.

International Publication No. 2017-212677 (hereinafter "Patent Document 1") discloses a frequency adjustment method for the MEMS resonance device, whereby a vibration arm is excited to cause the end portion thereof to strike the upper and lower lids to change the weight of the end portion and thereby adjust the frequency of the resonator.

According to the frequency adjustment method described in Patent Document 1, however, dust may be generated due to the vibration arm striking the lower lid and the dust may attach to the resonator. The dust attached to the resonator fluctuates the frequency, which may deteriorate the reliability of the device.

SUMMARY OF THE INVENTION

Accordingly, it is an object of the invention to provide a resonance device with improved reliability and a method of manufacturing the resonance device.

In an exemplary aspect, a method of manufacturing a resonance device is provided that includes preparing a resonance device and adjusting a frequency of the resonator. The resonance device includes a lower lid, an upper lid joined to the lower lid, and a resonator that has a vibration arm configured to vibrate in bending vibration in an interior space formed between the lower lid and the upper lid. The adjusting of the frequency of the resonator further includes vibrating the vibration arm in bending vibration and thereby causing an end of the vibration arm to strike the lower lid at an impact speed of $3.5 \times 10^3$ μm/sec or more. The end of the vibration arm is made of silicon oxide, and the lower lid is made of silicon.

According to another exemplary aspect, a method of manufacturing a resonance device is provided that includes preparing a resonance device and adjusting a frequency of the resonator. The resonance device includes a lower lid, an upper lid joined to the lower lid, and a resonator that has a vibration arm configured to vibrate in bending vibration in an interior space formed between the lower lid and the upper lid. The adjusting of the frequency of the resonator further includes a step of vibrating the vibration arm in bending vibration and thereby causing the vibration arm to strike the lower lid so as to produce dust of the lower lid and dust of the vibration arm. A breaking stress of a portion of the lower lid that a portion of the vibration arm strikes is smaller than a breaking stress of the portion of the vibration arm that strikes the portion of the lower lid. In the interior space, a volume of the dust derived from the lower lid is 2.5 times or less of a volume of the dust derived from the vibration arm.

According to another exemplary aspect, a resonance device includes a lower lid, an upper lid joined to the lower lid, and a resonator that has a vibration arm configured to vibrate in bending vibration in an interior space formed between the lower lid and the upper lid. In the resonance device, a breaking stress of a portion of the lower lid that a portion of the vibration arm strikes is smaller than a breaking stress of the portion of the vibration arm that strikes the portion of the lower lid. In the interior space, a volume of dust derived from the lower lid is 2.5 times or less of a volume of dust derived from the vibration arm.

According to the exemplary aspects of the present invention, a resonance device is provided with improved reliability and a method of manufacturing the resonance device is provided.

DETAILED DESCRIPTION OF EMBODIMENT

An exemplary embodiment of the present invention will be described with reference to the drawings. The drawings illustrating the present embodiment are examples, in which dimensions and shapes of elements are illustrated only schematically. In general, the technical scope of the present invention is not limited to the illustrated embodiment.

Figure 1:
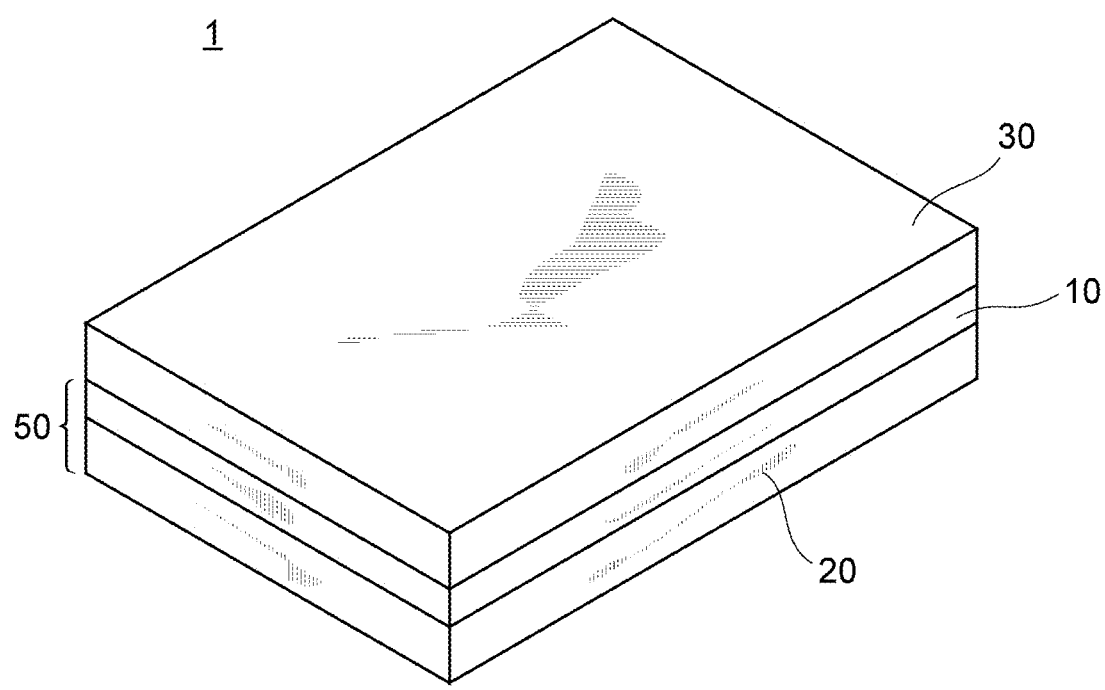
FIG. 1 is a perspective view schematically illustrating an exterior of a resonance device according to an exemplary embodiment.
Figure 1:
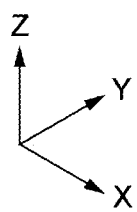
Figure 2:
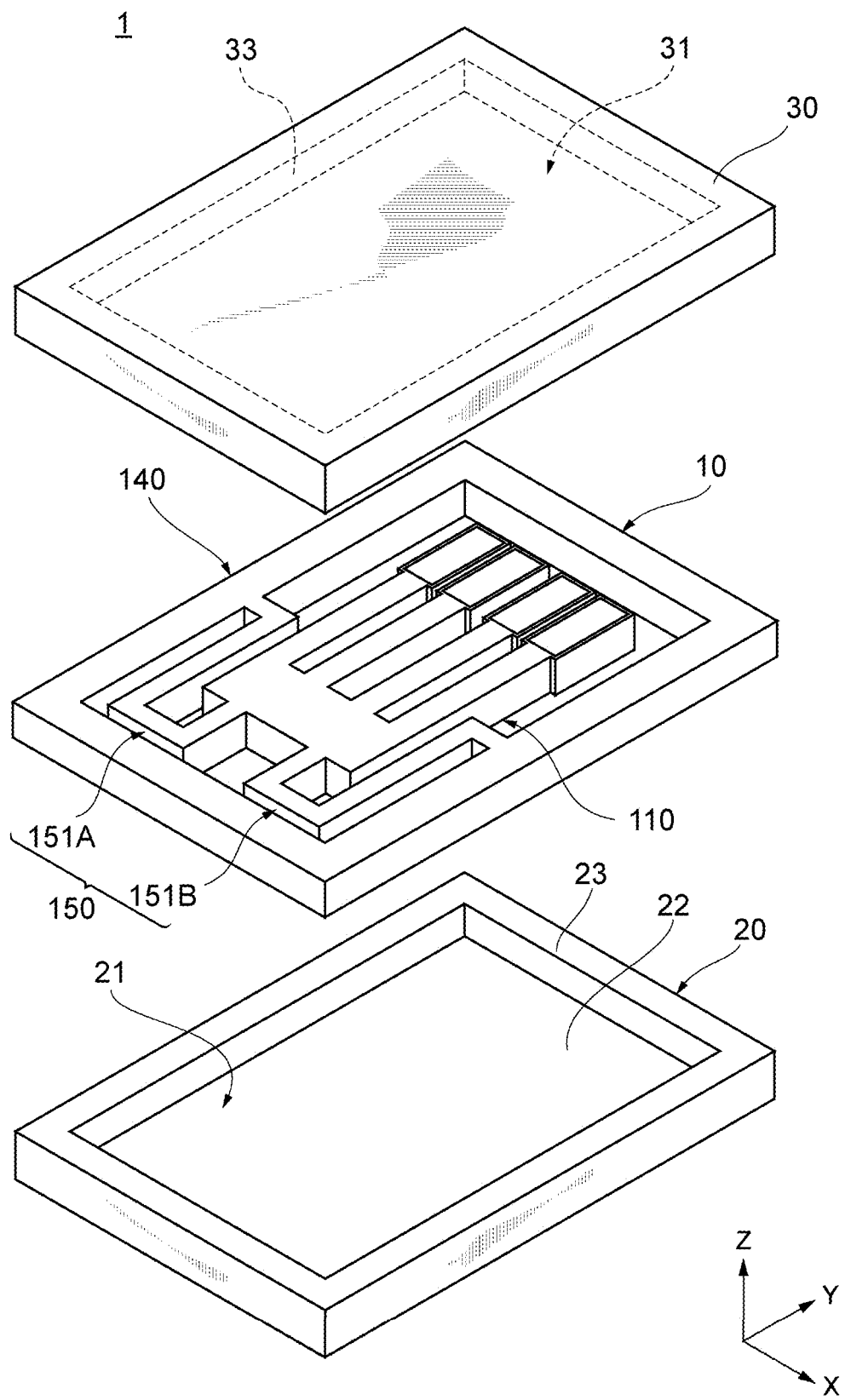
FIG. 2 is an exploded perspective view schematically illustrating a structure of the resonance device according to the exemplary embodiment.

A structure of a resonance device 1 according to the exemplary embodiment will be described with reference to FIGS. 1 and 2. FIG. 1 is a perspective view schematically illustrating the exterior of the resonance device according to the embodiment. FIG. 2 is an exploded perspective view schematically illustrating the structure of the resonance device of the embodiment.

The following describes elements of the resonance device 1. For purposes of this disclosure the orthogonal coordinate system consisting of the X-axis, the Y-axis, and the Z-axis may be provided in the drawings for convenience in order to help understand positional relationships between elements and relationships between the drawings. Directions parallel to the X-axis, the Y-axis, and the Z-axis are referred to as the X-axis direction, the Y-axis direction, and the Z-axis direction, respectively. A plane defined by the X-axis and the Y-axis is referred to as the XY plane. The YZ plane and the ZX plane are defined in the same manner.

The resonance device 1 includes a resonator 10, a lower lid 20, and an upper lid 30. The lower lid 20 and the upper lid 30 opposes each other with the resonator 10 interposed therebetween. The lower lid 20, the resonator 10, and the upper lid 30 are laminated together in this order in the Z-axis direction. The resonator 10 and the lower lid 20 are joined to each other and thereby form a MEMS substrate 50. The upper lid 30 is joined to the resonator 10 of the MEMS substrate 50. In other words, the upper lid 30 is joined to the lower lid 20 with the resonator 10 interposed therebetween. The lower lid 20 and the upper lid 30 form a package structure for accommodating the resonator 10.

In an exemplary aspect, the resonator 10 is a MEMS vibrator device manufactured using MEMS technology. The resonator 10 includes a vibrator 110, a holder frame 140, and holding arms 150. The vibrator 110 is held to be configured to vibrate in an interior space formed between the lower lid 20 and the upper lid 30. When the vibrator 110 is not activated (e.g., when voltage is not applied), the vibrator 110 stays so as to extend along the XY plane. When the vibrator 110 is activated (e.g., when voltage is applied), the vibrator 110 vibrates so as to bend in the Z-axis direction. In other words, the vibrator 110 vibrates in an out-of-plane bending vibration mode. The holder frame 140 (also referred to as a "frame") is, for example, shaped like a rectangular frame and disposed so as to surround the vibrator 110. The holder frame 140 also contributes to formation of the interior space of the package structure together with the lower lid 20 and the upper lid 30. The holding arms 150 connect the vibrator 110 to the holder frame 140.

In operation, the resonator 10 has a frequency band, for example, of 1 kHz or more and 1 MHz or less, for example. The resonator 10 having such a frequency band is affected largely by the weight of the vibrator 110, which causes the frequency to change. The frequency of the resonance device 1 may deviate from the target frequency in and after a step of joining the resonator 10, the lower lid 20, and the upper lid 30 together to seal the interior space. According to the present embodiment, even if the frequency of the resonance device tends to change easily, the frequency can be adjusted to reduce the frequency deviation after sealing.

The lower lid 20 includes a bottom plate 22 and side walls 23. The bottom plate 22 is a rectangular plate disposed along the XY plane, and the side walls 23 rise from the peripheral edges of the bottom plate 22 toward the upper lid 30. The side walls 23 are joined to the holder frame 140 of the resonator 10. The lower lid 20 has a cavity 21 defined by the bottom plate 22 and the side walls 23. The cavity 21 faces the resonator 10 of the vibrator 110. The cavity 21 is shaped like a cuboid that opens upward.

The upper lid 30 includes a bottom plate 32 and side walls 33. The bottom plate 32 is a rectangular plate disposed along the XY plane, and the side walls 33 rise from the peripheral edges of the bottom plate 32 toward the lower lid 20. Moreover, the side walls 33 are joined to the holder frame 140 of the resonator 10. The upper lid 30 has a cavity 31 defined by the bottom plate 32 and the side walls 33. The cavity 31 faces the resonator 10 of the vibrator 110. In an exemplary aspect, the cavity 31 is shaped like a cuboid that opens downward. The cavity 21 and the cavity 31 oppose each other with the vibrator 110 of the resonator 10 being interposed therebetween so as to form the interior space of the package structure.

Figure 3:
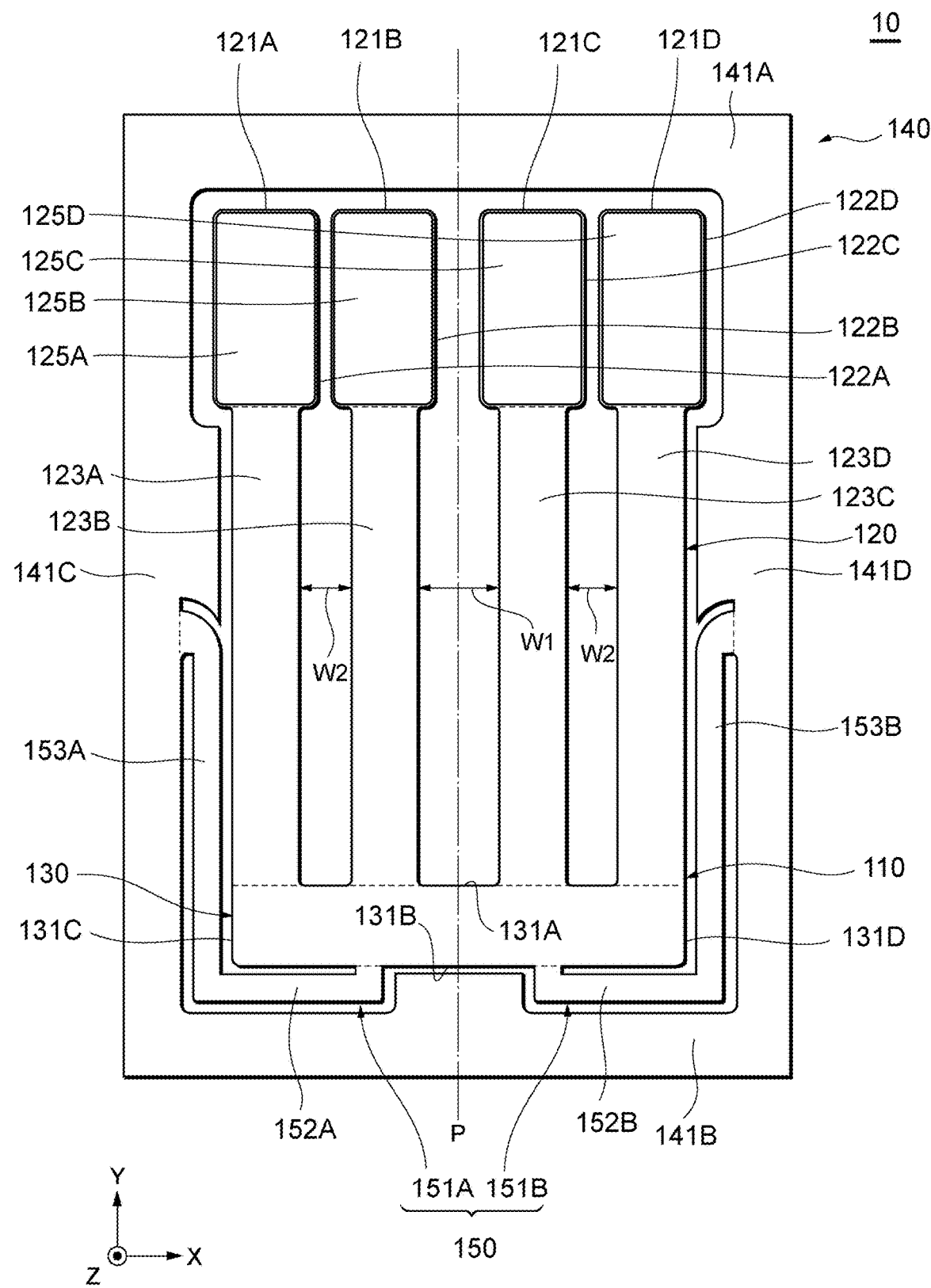
FIG. 3 is a plan view schematically illustrating a structure of a resonator according to the exemplary embodiment.

Next, referring to FIG. 3, the structure of the resonator 10 (i.e., the vibrator 110, the holder frame 140, and the holding arms 150) will be described in detail when the XY plane is viewed in plan from the side of the upper lid 30. FIG. 3 is a plan view schematically illustrating the structure of the resonator of the present embodiment.

The resonator 10 is formed symmetrically, for example, with respect to an imaginary plane P extending parallel to the YZ plane. In other words, the vibrator 110, the holder frame 140, and the holding arms 150 are formed substantially symmetrically with respect to the imaginary plane P.

The vibrator 110 is formed inside the holder frame 140 as viewed in plan from the side of the upper lid 30. Gaps having a predetermined size are formed between the vibrator 110 and the holder frame 140. The vibrator 110 includes an excitation portion 120 and a base portion 130 connected to the excitation portion 120. The excitation portion 120 further includes four vibration arms 121A, 121B, 121C, and 121D. It is noted that the number of vibration arms is not limited to four but can be any number, in other words, one or more. In the present embodiment, the excitation portion 120 and the base portion 130 are formed integrally.

The vibration arms 121A to 121D extend in the Y-axis direction and are arranged side by side in the X-axis direction in this order. Moreover, the vibration arms 121A to 121D include respective fixed ends fixed to the base portion 130 and respective free ends positioned furthest away from the base portion 130. The vibration arms 121A to 121D include respective end portions 122A to 122D and respective arm portions 123A to 123D that connect the corresponding end portions 122A to 122D to the base portion 130. The end portions 122A to 122D are disposed at the corresponding free ends that are displaced relatively largely in the vibrator 110. The imaginary plane P is positioned between the vibration arm 121B and the vibration arm 121C.

Of the four vibration arms, the vibration arms 121A and 121D are outside vibration arms disposed outside in the X-axis direction, and the vibration arms 121B and 121C are inside vibration arms disposed inside in the X-axis direction. With respect to the imaginary plane P, the inside vibration arm 121B and the inside vibration arm 121C are shaped symmetrically, and the outside vibration arm 121A and the outside vibration arm 121D are also shaped symmetrically. A gap having a width W1 is formed between an arm portion 123B of the inside vibration arm 121B and an arm portion 123C of the inside vibration arm 121C. Moreover, a gap having a width W2 is formed between an arm portion 123A of the outside vibration arm 121A and an arm portion 123B of the inside vibration arm 121B. Similarly, a gap having a width W2 is also formed between the arm portion 123C and an arm portion 123D. The width W1 is greater than the width W2. With this configuration, the vibration characteristics and the durability are improved. For example, the width W1 is about 25 μm, and the width W2 is about 10 μm. The size relationship between the width W1 and the width W2 is not limited to this configuration. For example, the width W1 can be equal to or smaller than the width W2.

The end portions 122A to 122D (also referred to as "ends") include respective metal films 125A to 125D on their surfaces facing the upper lid 30. Each of the metal films 125A to 125D serves as a mass adding film that increases a unit mass of each of the end portions 122A to 122D relative to a unit mass of each of the arm portions 123A to 123D. Here, the unit mass is a mass per a unit length in the Y-axis direction (hereinafter referred to simply as "mass"). This configuration improves the vibration characteristics of the vibrator 110 while reducing the lengths of the vibration arms 121A to 121D. The metal films 125A to 125D may be used to serve as so-called frequency adjusting films for adjusting the resonance frequency by abrading a portion of each of the metal films 125A to 125D.

In the X-axis direction, the width of each of the end portions 122A to 122D is greater than the width of each of the arm portions 123A to 123D. This configuration increases the weight of each of the end portions 122A to 122D. However, insofar as the weight of each of the end portions 122A to 122D is greater than that of each of the arm portions 123A to 123D, the width of each of the end portions 122A to 122D in the X-axis direction can be equal to or smaller than that of each of the arm portions 123A to 123D.

Each of the end portions 122A to 122D is shaped substantially like a rectangle having four rounded corners (for example, having circular-arc corners). Each of the arm portions 123A to 123D is shaped substantially like a rectangle having circular-arc portions at the base portion 130 and at each of the end portions 122A to 122D. The shapes of the end portions 122A to 122D and of the arm portions 123A to 123D are not limited to the above. For example, each of the end portions 122A to 122D can be shaped like a trapezoid or shaped like the letter L in alternative aspects. Moreover, each of the arm portions 123A to 123D can be shaped like a trapezoid or can have a slit formed therein.

The base portion 130 has a front end 131A, a rear end 131B, a left end 131C, and a right end 131D. The front end 131A, the rear end 131B, the left end 131C, and the right end 131D are part of the peripheral portion of the base portion 130. The front end 131A is the end extending in the X-axis direction and positioned near the vibration arms 121A to 121D. The rear end 131B is the end extending in the X-axis direction and positioned opposite to the vibration arms 121A to 121D. The left end 131C is the end extending in the Y-axis direction and positioned closer to the vibration arm 121A than to the vibration arm 121D. The right end 131D is the end extending in the Y-axis direction and positioned closer to the vibration arm 121D than to the vibration arm 121A. The vibration arms 121A to 121D are connected to the front end 131A.

According to the exemplary aspect, the base portion 130 is shaped substantially like a rectangle with the front end 131A and the rear end 131B being long sides and with the left end 131C and the right end 131D being short sides. The imaginary plane P extends along the perpendicular bisector of the front end 131A and of the rear end 131B. It is noted that the shape of the base portion 130, however, is not limited to the above insofar as the base portion 130 is formed substantially symmetrically with respect to the imaginary plane P. For example, the base portion 130 can be shaped like a trapezoid in which one of the front end 131A and the rear end 131B is longer than the other. Moreover, at least one of the front end 131A, the rear end 131B, the left end 131C, and the right end 131D can be bent or curved.

A base portion length, which is a maximum length in the Y-axis direction between the front end 131A and the rear end 131B, is, for example, approximately 40 μm. A base portion width, which is a maximum length in the X-axis direction between the left end 131C and the right end 131D, is, for example, approximately 300 μm. It is also noted that in the example illustrated in FIG. 3, the base portion length corresponds to the length of the left end 131C and of the right end 131D, and the base portion width corresponds to the length of the front end 131A and of the rear end 131B.

The holder frame 140 is a portion that holds the vibrator 110 in the interior space formed by the lower lid 20 and the upper lid 30. For example, the holder frame 140 surrounds the vibrator 110. As illustrated in FIG. 3, the holder frame 140 has a front bar 141A, a rear bar 141B, a left bar 141C, and a right bar 141D as viewed in plan from the side of the upper lid 30. The front bar 141A, the rear bar 141B, the left bar 141C, and the right bar 141D are portions of a substantially rectangular frame that surrounds the vibrator 110. More specifically, the front bar 141A is a portion extending in the X-axis direction and positioned closer to the excitation portion 120 than to the base portion 130. The rear bar 141B is a portion extending in the X-axis direction and positioned closer to the base portion 130 than to the excitation portion 120. The left bar 141C is a portion extending in the Y-axis direction and positioned closer to the vibration arm 121A than to the vibration arm 121D. The right bar 141D is a portion extending in the Y-axis direction and positioned closer to the vibration arm 121D than to the vibration arm 121A. The front bar 141A and the rear bar 141B are bisected by the imaginary plane P.

Opposite ends of the left bar 141C are connected to one end of the front bar 141A and to one end of the rear bar 141B, respectively. Similarly, opposite ends of the right bar 141D are connected to the other end of the front bar 141A and to the other end of the rear bar 141B, respectively. The front bar 141A and the rear bar 141B oppose each other in the Y-axis direction with the vibrator 110 interposed therebetween. The left bar 141C and the right bar 141D oppose each other in the X-axis direction with the vibrator 110 interposed therebetween. It is noted that the holder frame 140 is not limited to the continuous frame that surrounds the vibrator 110 circumferentially, but can be a member that surrounds the vibrator 110 at least partially in alternative aspects.

The holding arms 150 are disposed inside the holder frame 140 and connects the base portion 130 to the holder frame 140. As illustrated in FIG. 3, the holding arms 150 include a left holding arm 151A and a right holding arm 151B as viewed in plan from the side of the upper lid 30. The imaginary plane P is positioned between the left holding arm 151A and the right holding arm 151B, and the left holding arm 151A and the right holding arm 151B are disposed symmetrically with respect to the imaginary plane P.

The left holding arm 151A connects the rear end 131B of the base portion 130 to the left bar 141C of the holder frame 140. The right holding arm 151B connects the rear end 131B of the base portion 130 to the right bar 141D of the holder frame 140. The left holding arm 151A includes a rear holding arm 152A and a side holding arm 153A, and the right holding arm 151B includes a rear holding arm 152B and a side holding arm 153B.

The rear holding arms 152A and 152B extend from the rear end 131B of the base portion 130 into the space between the rear end 131B of the base portion 130 and the holder frame 140. More specifically, the rear holding arm 152A extends from the rear end 131B of the base portion 130 toward the rear bar 141B and is bent so as to extend toward the left bar 141C. The rear holding arm 152B extends from the rear end 131B of the base portion 130 toward the rear bar 141B and is bent so as to extend toward the right bar 141D. The width of the rear holding arms 152A and 152B is smaller than the width of the vibration arms 121A to 121D.

The side holding arm 153A is positioned between the outside vibration arm 121A and the holder frame 140 and extends along the outside vibration arm 121A. Similarly the side holding arm 153B is positioned between the outside vibration arm 121D and the holder frame 140 and extends along the outside vibration arm 121D. More specifically, the side holding arm 153A extends from the end of the rear holding arm 152A near the left bar 141C toward the front bar 141A and is bent and connected to the left bar 141C. The side holding arm 153B extends from the end of the rear holding arm 152B near the right bar 141D toward the front bar 141A and is bent and connected to the right bar 141D. The width of the side holding arms 153A and 153B is substantially equal to the width of the rear holding arms 152A and 152B.

It is noted that the configuration of the holding arms 150 is not limited to the above. For example, the holding arms 150 can be connected to the left end 131C and the right end 131D of the base portion 130, respectively. Moreover, the holding arms 150 can be connected to the front bar 141A or to the rear bar 141B of the holder frame 140. The number of the holding arms 150 can be one or can be three or more.

Figure 4:
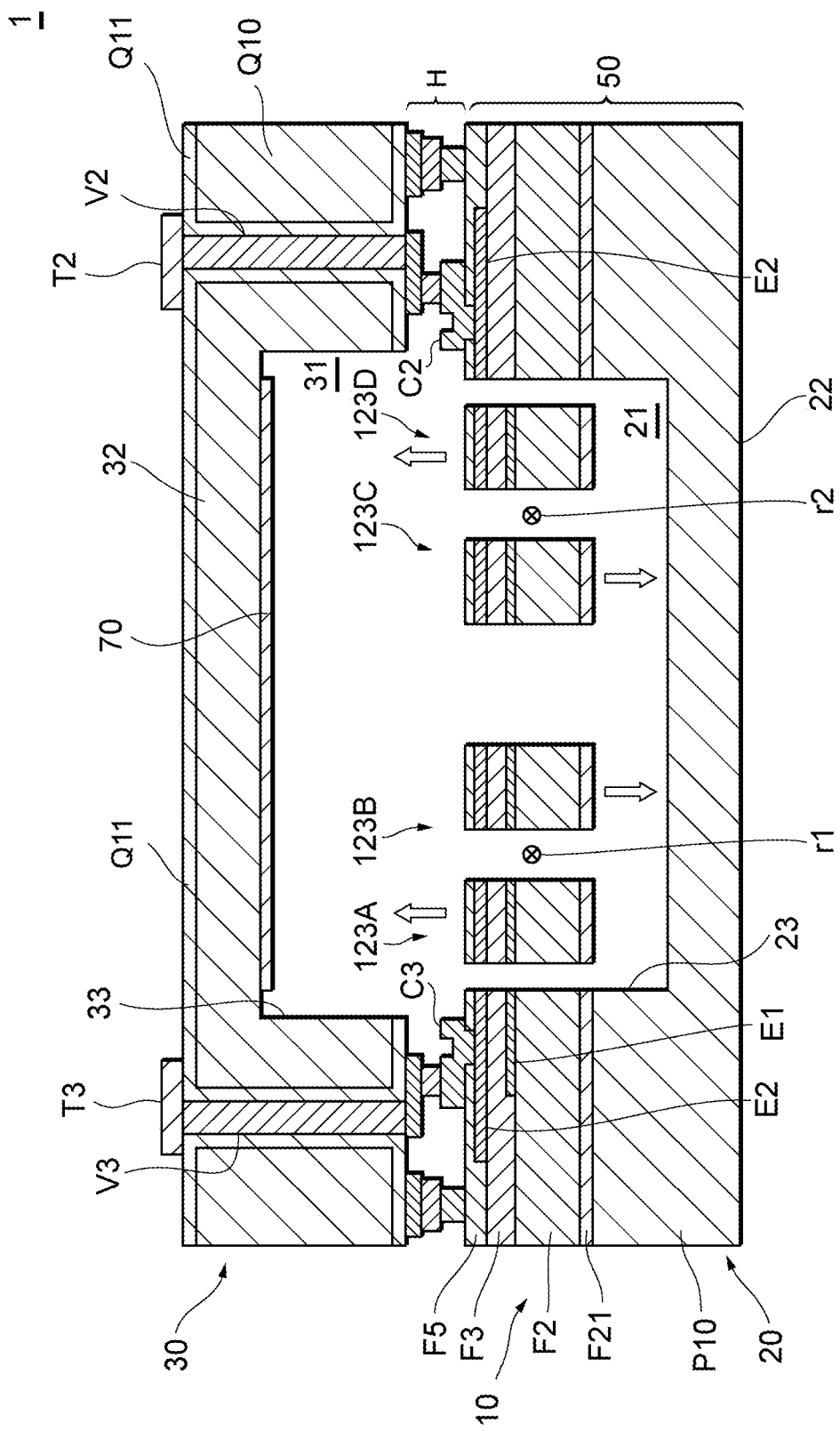
FIG. 4 is a cross-sectional view along the X-axis, conceptually illustrating a lamination structure of the resonance device of FIG. 1.
Figure 5:
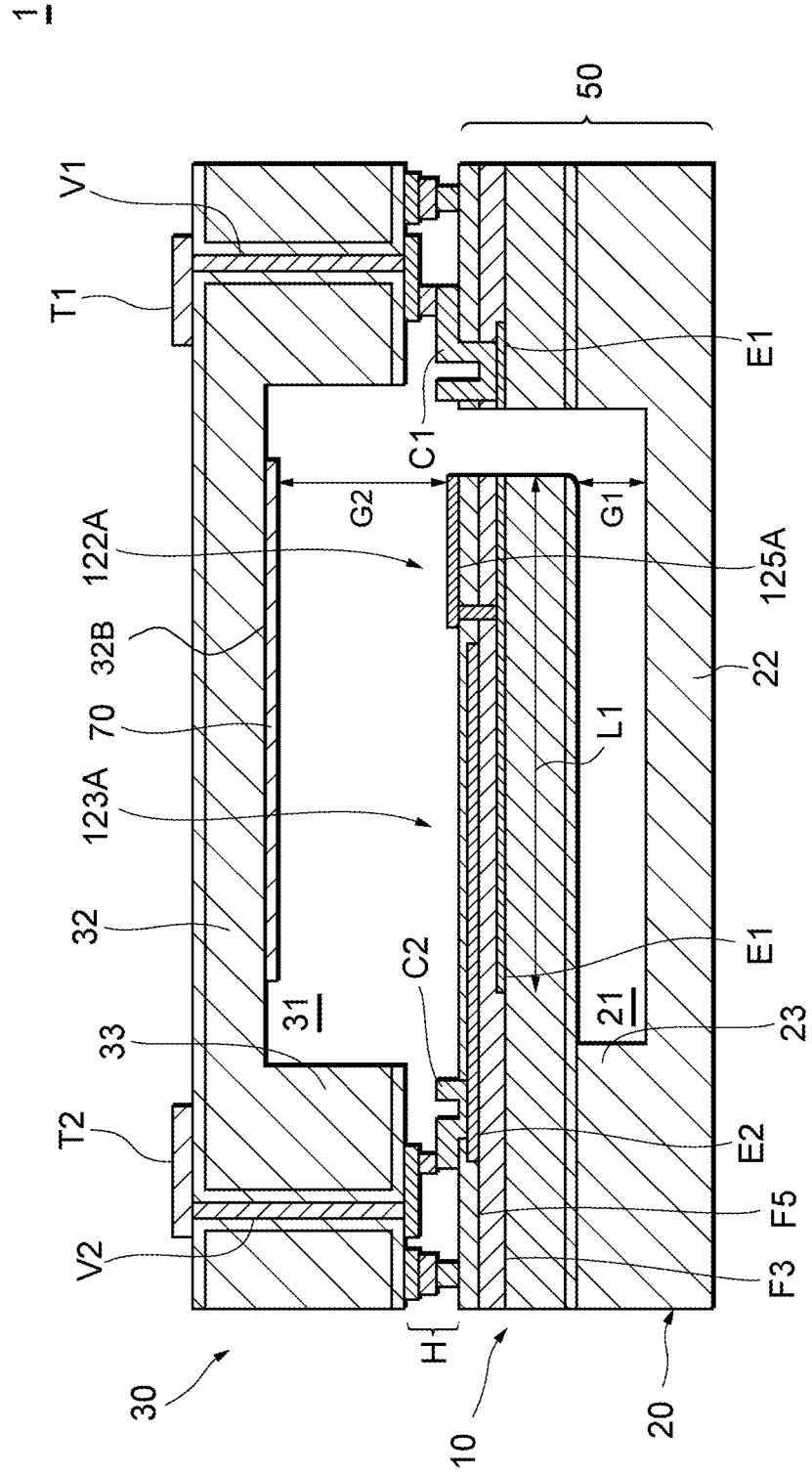
FIG. 5 is another cross-sectional view along the Y-axis, conceptually illustrating the lamination structure of the resonance device of FIG. 1.

Next, a lamination structure of the resonance device 1 of the exemplary embodiment will be described with reference to FIGS. 4 and 5. FIG. 4 is a cross-sectional view along the X-axis, conceptually illustrating the lamination structure of the resonance device of FIG. 1. FIG. 5 is another cross-sectional view along the Y-axis, conceptually illustrating the lamination structure of the resonance device of FIG. 1. It is noted that the cross section of FIG. 4 is not necessarily taken along a single plane and the cross section of FIG. 5 is not necessarily taken along a single plane. For example, FIG. 4 illustrates the arm portions 123A to 123D, extended wires C2 and C3, and via electrodes V2 and V3 for the purpose of describing the lamination structure. The via electrodes V2 and V3, however, may be formed at positions shifted in the Y-axis direction from the ZX plane that cuts the arm portions 123A to 123D in FIG. 4.

As shown the resonator 10 is held between the lower lid 20 and the upper lid 30. More specifically, the holder frame 140 of the resonator 10 is joined to the side walls 23 of the lower lid 20 and also to the side walls 33 of the upper lid 30. Accordingly, the lower lid 20, the upper lid 30, and the holder frame 140 of the resonator 10 form the interior space in which the vibrator 110 can vibrate. According to an exemplary aspect, the resonator 10, the lower lid 20, and the upper lid 30 are formed of silicon (Si) substrates. The resonator 10, the lower lid 20, and the upper lid 30 can be formed of SOI (silicon on insulator) substrates each of which has a silicon layer and a silicon oxide layer laminated together. Moreover, the resonator 10, the lower lid 20, and the upper lid 30 can be formed of substrates other than the silicon substrates, such as compound semiconductor substrates, glass substrates, ceramic substrates, or resin substrates, insofar as the substrates can be processed using fine-processing technology.

The vibrator 110, the holder frame 140, and the holding arms 150 are integrally formed in the same process. In the resonator 10, a metal film E1 is laminated on a silicon substrate F2, which is an example of the substrate. A piezoelectric film F3 is laminated on the metal film E1, and a metal film E2 is laminated on the piezoelectric film F3. A protective film F5 is laminated on the metal film E2 so as to cover the metal film E2. The metal films 125A to 125D described above are further laminated on respective protective films F5 of the end portions 122A to 122D. The shapes of the vibrator 110, the holder frame 140, and the holding arms 150 are formed by patterning by which the laminated body made of the silicon substrate F2, the metal film E1, the piezoelectric film F3, the metal film E2, and the protective film F5 are removed partially. This partial removal can be performed, for example, using dry etching using argon (Ar) ion beams According to an exemplary aspect, the silicon substrate F2 is made of a degenerated n-type silicon (Si) semiconductor having a thickness of about 6 μm. The silicon substrate F2 can contain phosphorus (P), arsenic (As), or antimony (Sb) as an n-type dopant. For example, the degenerated silicon (Si) used for the silicon substrate F2 has a resistance of less than 16 mΩ·cm, and more desirably, has a resistance of 1.2 mΩ·cm or less. A silicon oxide layer F21, such as $SiO_2$, is formed on the lower surface of the silicon substrate F2. The silicon oxide layer F21 is exposed to the cavity 21 of the lower lid 20.

The silicon oxide layer F21 serves as a compensation layer of temperature characteristics. In other words, the silicon oxide layer F21 decreases the temperature coefficient of resonance frequency (i.e., the rate of change of resonance frequency per a unit temperature change) of the resonator 10 at least in the vicinity of room temperature. In other words, the silicon oxide layer F21 improves the temperature characteristics of the resonator 10. It is noted that the compensation layer of temperature characteristics may be formed on the upper surface of the silicon substrate F2 or may be formed on both of the upper and lower surfaces of the silicon substrate F2 according to alternative aspects.

Moreover, the silicon oxide layer F21 is made of a material having a lower hardness compared with the material of the bottom plate 22 of the lower lid 20. For purposes of this disclosure, the term "hardness" as used herein is the Vickers hardness. The Vickers hardness of the silicon oxide layer F21 is desirably 10 GPa or less, and the Vickers hardness of the bottom plate 22 of the lower lid 20 is desirably 10 GPa or more. This enables the silicon oxide layers F21 of the end portions 122A to 122D to be abraded easily when the end portions 122A to 122D strike the bottom plate 22 of the lower lid 20 in a step of adjusting frequency. In the step of adjusting frequency, part of the silicon substrate F2 may also be abraded. Accordingly, the Vickers hardness of the silicon substrate F2 is desirably lower than that of the silicon oxide layer F21, and more desirably, is 10 GPa or less.

As illustrated in FIG. 5, the thickness of the silicon oxide layer F21 becomes smaller toward the free end at the edge of each of the end portions 122A to 122D of the vibration arms 121A to 121D, the edge facing the lower lid 20. This is because the edge of each of the end portions 122A to 122D facing the lower lid 20 strikes the bottom plate 22 of the lower lid 20 and is abraded off in the step of adjusting frequency. It is noted that a portion of the silicon oxide layer F21 at the edge of each of the end portions 122A to 122D facing the lower lid 20 may be abraded off completely and the silicon substrate F2 may be exposed to the lower lid 20.

Each of the metal films E1 and E2 includes a portion serving as an excitation electrode and a portion serving as an extended electrode. The excitation electrode causes the corresponding one of the vibration arms 121A to 121D to vibrate, and the extended electrode electrically connects the excitation electrode to an external power source. The portion of the metal film E1 and the portion of the metal film E2 that serve as the excitation electrodes oppose each other with the piezoelectric film F3 interposed therebetween in each of the arm portions 123A to 123D of the vibration arms 121A to 121D. According to the exemplary aspect, the portions of the metal films E1 and E2 that serve as extended electrodes are extended, for example, from the base portion 130 to the holder frame 140 via the holding arms 150. The metal film E1 has electrical continuity over the entire resonator 10. The metal film E2 has electrically separated portions, of which one portion is formed in the outside vibration arms 121A and 121D and the other portion is formed in the inside vibration arms 121B and 121C. The metal film E1 corresponds to a lower electrode, and the metal film E2 corresponds to an upper electrode.

In an exemplary aspect, the thickness of each of the metal films E1 and E2 is, for example, 0.1 μm or more and 0.2 μm or less. The metal films E1 and E2 are patterned into the excitation electrodes, the extended electrodes, and others, using removing processing, such as etching, after the metal films are formed. The metal films E1 and E2 are made of a material of which the crystal has a body-centered cubic structure. More specifically, the metal films E1 and E2 are made, for example, of molybdenum (Mo) or tungsten (W). In the case of the silicon substrate F2 being a degenerated semiconductor substrate having a high conductivity, the metal film E1 may be omitted and the silicon substrate F2 may serve as the lower electrode.

The piezoelectric film F3 is a thin film made of a piezoelectric material that can convert electrical energy and mechanical energy to and from each other. The piezoelectric film F3 expands and contracts in the Y-axis direction on the XY plane in response to an electric field impressed between the metal films E1 and E2. The expansion and contraction of the piezoelectric film F3 bend each of the vibration arms 121A to 121D in the direction and displaces the free end toward the bottom plate 22 of the lower lid 20 or toward the bottom plate 32 of the upper lid 30. In other words, the resonator 10 vibrates in an out-of-plane bending vibration mode.

In an exemplary aspect, the piezoelectric film F3 is made of a material having a hexagonal wurtzite crystalline structure. For example, the main component of the material can be a nitride or an oxide, such as aluminum nitride (AlN), scandium-doped aluminum nitride (ScAlN), zinc oxide (ZnO), gallium nitride (GaN), indium nitride (InN). The scandium-doped aluminum nitride is an aluminum nitride-based compound in which part of aluminum is replaced with scandium. The part of aluminum can be replaced with two elements as a substitute for scandium, for example, magnesium (Mg) and niobium (Nb), or magnesium (Mg) and zirconium (Zr). For example, the thickness of the piezoelectric film F3 is about 1 μm, but the thickness may be about 0.2 μm to 2 μm.

The protective film F5 protects, for example, the metal film E2 from oxidation and can be is formed on the surface of the metal film E2 that faces the upper lid 30. The protective film F5 (except for portions formed on the end portions 122A to 122D of the vibrator 110) is exposed to the cavity 31 of the upper lid 30. The protective film F5 is not necessarily exposed to the bottom plate 32 of the upper lid 30 insofar as the protective film F5 is formed on the surface of the metal film E2 facing the upper lid 30. For example, a parasitic-capacitance reduction film, which serves to reduce the parasitic capacitance of the wiring formed on the resonator 10, can be laminated on the protective film F5. For example, the material of the protective film F5 is, for example, an oxide, a nitride, or an oxynitride, containing aluminum (Al), silicon (Si), or tantalum (Ta).

The metal films 125A to 125D are formed on respective surfaces of the protective films F5 of the end portions 122A to 122D, the surfaces facing the upper lid 30. The metal films 125A to 125D are exposed to the cavity 31 of the upper lid 30. The metal films 125A to 125D are desirably made of a material of which the mass reduction rate by etching is greater than that of the protective film F5 from the point of view of the metal films 125A to 125D serving as frequency adjusting films. The mass reduction rate is expressed as the product of etching rate and density. The etching rate is the thickness removed or etched per unit time. If the protective film F5 and the metal films 125A to 125D have the above-described relationship in the mass reduction rate, the relationship in the etching rate therebetween does not matter. The metal films 125A to 125D are desirably made of a material having a greater specific gravity from the point of view of the metal films 125A to 125D serving as mass adding films. For these reasons, the metal films 125A to 125D are made, for example, of a metallic material, such as molybdenum (Mo), tungsten (W), gold (Au), platinum (Pt), nickel (Ni) or titanium (Ti). Part of the protective film F5 may be removed in trimming processing performed on the metal films 125A to 125D. In this case, the protective film F5 serves as a frequency adjusting film.

In an exemplary aspect, an upper part of each of the metal films 125A to 125D is trimmed off in a step of adjusting frequency before sealing. For example, the trimming is carried out using the dry etching in which the metal films 125A to 125D are irradiated with argon (Ar) ion beams. The method of using ion beams is efficient in processing the metal films 125A to 125D because a wide region can be irradiated with ion beams. The ion beams, however, may charge the metal films 125A to 125D. The charged metal films 125A to 125D may change the vibrating paths of the vibration arms 121A to 121D due to Coulomb interactions and deteriorate the vibration characteristics of the resonator 10. To prevent this from occurring, the metal films 125A to 125D are desirably grounded.

In the example illustrated in FIG. 5, the metal film 125A is electrically connected to the metal film E1 by a via electrode piercing through the protective film F5 and the piezoelectric film F3. The metal films 125B to 125D have the same structure (not illustrated) and are electrically connected to the metal film E1 by respective via electrodes. For example, side electrodes may be disposed on respective side surfaces of the end portions 122A to 122D, and the metal films 125A to 125D may be electrically connected to the metal film E1 using the side electrodes. The metal films 125A to 125D can be electrically connected to the metal films E2.

As further shown, extended wires C1, C2, and C3 are formed on the protective film F5 of the holder frame 140. The extended wire C1 is electrically connected to the metal film E1 via a through-hole formed through the piezoelectric film F3 and the protective film F5. The extended wire C2 is electrically connected, via a through-hole formed through the protective film F5, to a portion of the metal film E2 that is formed in the outside vibration arms 121A and 121D. The extended wire C3 is electrically connected, via a through-hole formed through the protective film F5, to the other portion of the metal film E2 that is formed in the inside vibration arms 121B and 121C. The extended wires C1 to C3 are made of a metallic material, such as aluminum (Al), germanium (Ge), gold (Au), or tin (Sn), for example.

The bottom plate 22 and the side walls 23 of the lower lid 20 are integrally formed of a silicon substrate P10. The silicon substrate P10 is made of non-degenerated silicon semiconductor and has a resistivity, for example, of 10 Ω·cm or more. The thickness of the lower lid 20 is, for example, 150 μm. When the vibration arms 121A to 121D are not activated, the size of a gap width G1 between the lower lid 20 and each of the end portions 122A to 122D of the vibration arms 121A to 121D corresponds to the distance between the silicon oxide layer F21 and the bottom plate 22 in the Z-axis direction.

For example, if the resonator 10 and the lower lid 20 are formed in the MEMS substrate 50, the silicon substrate P10 of the lower lid 20 corresponds to a handle wafer of an SOI substrate, the silicon oxide layer F21 of the resonator 10 corresponds to a BOX layer of the SOI substrate, and the silicon substrate F2 of the resonator 10 corresponds to a device layer of the SOI substrate. In this case, semiconductor elements and circuits may be formed in a portion of the MEMS substrate 50 outside the portion in which the resonance device 1 is formed.

The bottom plate 32 and the side walls 33 of the upper lid 30 are integrally formed of a silicon substrate Q10. The silicon substrate Q10 includes a silicon oxide layer Q11. The silicon oxide layer Q11 is formed on the surface of the silicon substrate Q10 except for the inside surfaces of the cavity 31. The silicon oxide layer Q11 may be formed by thermally oxidizing the silicon substrate Q10 or by using chemical vapor deposition (CVD). The thickness of the upper lid 30 is, for example, about 150 μm.

As further shown, a metal film 70 is formed on the bottom plate 32 of the upper lid 30 and, in particular, is formed on the surface of the silicon substrate Q10 facing the resonator 10 at least in a region opposing the end portions 122A to 122D of the vibration arms 121A to 121D. The metal film 70 can be a getter film that can occlude gas in the interior space defined by the cavities 21 and 31 to increase the degree of vacuum. For example, the metal film 70 occludes hydrogen gas. For example, the metal film 70 contains titanium (Ti), zirconium (Zr), vanadium (V), niobium (Nb), or tantalum (Ta), or an alloy containing at least one of these. The metal film 70 can contain an oxide of an alkali metal or an alkaline-earth metal. For example, between the silicon substrate Q10 and the metal film 70, a layer (not illustrated) that prevents hydrogen from diffusing from the silicon substrate Q10 to the metal film 70 or a layer that improves contact between the silicon substrate Q10 and the metal film 70 can be provided. When the vibration arms 121A to 121D are not activated, the size of a gap width G2 between the upper lid 30 and each of the end portions 122A to 122D of the vibration arms 121A to 121D corresponds to the distance between the metal film 70 and each of the metal films 125A to 125D in the Z-axis direction.

In an exemplary aspect, the gap width G2 at the side of the upper lid 30 is greater than the gap width G1 at the side of the lower lid 20. Accordingly, when the vibration arms 121A to 121D increase the amplitude of vibration, the vibration arms 121A to 121D come into contact with the lower lid 20 earlier than with the upper lid 30. In other words, a maximum amplitude of vibration of each of the vibration arms 121A to 121D is substantially equal to the gap width G1 at the side of the lower lid 20.

It is noted that the resonator 10 may be warped upward or downward when the resonator 10 is not activated insofar as the gap width G2 at the side of the upper lid 30 is greater than the gap width G1 at the side of the lower lid 20. For purposes of this disclosure, the expression "the resonator 10 warped upward" means that the resonator 10 is formed such that the distance between the resonator 10 and the upper lid 30 becomes smaller as the distance from the base portion 130 becomes greater or as the distance to each of the end portions 122A to 122D becomes smaller. In addition, for purposes of this disclosure, the expressi"n "the resonator 10 warped downw"rd" means that the resonator 10 is formed such that the distance between the resonator 10 and the lower lid 20 becomes smaller as the distance from the base portion 130 becomes greater or as the distance to each of the end portions 122A to 122D becomes smaller.

As further shown, the upper lid 30 has terminals T1, T2, and T3. The terminals T1, T2, and T3 are formed on a surface of the upper lid 30, the surface being positioned opposite to the resonator 10. The terminals T1, T2, and T3 are formed on the silicon oxide layer Q11 and are isolated from each other. The terminal T1 is a mounting terminal that connects the metal film E1 to the ground. The terminal T2 is a mounting terminal that electrically connects the metal film E2 for the outside vibration arms 121A and 121D to an external power source. The terminal T3 is a mounting terminal that electrically connects the metal film E2 for the inside vibration arms 121B and 121C to an external power source. For example, the terminals T1, T2, and T3 are formed such that a metallized layer (base layer) made of chromium (Cr), tungsten (W), or nickel (Ni) is plated with a metal, such as nickel (Ni), gold (Au), silver (Ag), or copper (Cu). In an exemplary aspect, a dummy terminal that is electrically isolated from the resonator 10 can be provided on the upper lid 30 for the purpose of controlling the parasitic capacitance or balancing the mechanical strength.

The upper lid 30 has via electrodes V1, V2, and V3. The via electrodes V1, V2, and V3 are formed in respective through-holes that pierce through the side walls 33 in the Z-axis direction. The via electrodes V1, V2, and V3 are each surrounded by the silicon oxide layer Q11 and are isolated from each other. The via electrode V1 electrically connects the terminal T1 to the extended wire C1, and the via electrode V2 electrically connects the terminal T2 to the extended wire C2. The via electrode V3 electrically connects the terminal T3 to the extended wire C3. The via electrodes V1, V2, and V3 are formed, for example, by filling the through-holes with polycrystalline silicon (Poly-Si), copper (Cu), or gold (Au).

In addition, a joining section H is formed between the side walls 33 of the upper lid 30 and the holder frame 140 of the resonator 10. The joining section H is formed as a continuous peripheral frame so as to surround the vibrator 110 as viewed in plan and that seals the interior space defined by the cavities 21 and the 31 gas-tightly so as to maintain the vacuum inside. The joining section H is made of metal films that are formed, for example, by laminating an aluminum (Al) layer, a germanium (Ge) layer, and another aluminum (Al) layer in this order. The metal films are joined together by eutectic bonding. The joining section H can contain gold (Au), tin (Sn), copper (Cu), titanium (Ti), aluminum (Al), germanium (Ge), or silicon (Si), or an alloy containing at least one of these. The joining section H can contain an insulator made of a metallic compound, such as titanium nitride (TiN) or tantalum nitride (TaN), for the purpose of improving contact between the resonator 10 and the upper lid 30.

Next, operation of the resonance device 1 will be described with reference to FIGS. 4 and 5. In the present embodiment, alternating voltages in opposite phase are applied to the terminal T2 and the terminal T3, respectively, while the terminal T1 is grounded. Accordingly, the phase of the electric field applied to the piezoelectric films F3 of the outside vibration arms 121A and 121D is opposite to the phase of the electric field applied to the piezoelectric films F3 of the inside vibration arms 121B and 121C. As a result, the outside vibration arms 121A and 121D vibrate in opposite phase to the vibration of the inside vibration arms 121B and 121C. For example, the end portions 122A and 122D of the outside vibration arms 121A and 121D are displaced toward the bottom plate 32 of the upper lid 30, while the end portions 122B and 122C of the inside vibration arms 121B and 121C are displaced toward the bottom plate 22 of the lower lid 20. Accordingly, the vibration arm 121A and the vibration arm 121B, which are positioned next to each other, vibrate oppositely in the up-down direction with respect to a central axis r1 that extends in the Y-axis direction between the vibration arm 121A and the vibration arm 121B. The vibration arm 121C and the vibration arm 121D, which are positioned next to each other, vibrate oppositely in the up-down direction with respect to a central axis r2 that extends in the Y-axis direction between the vibration arm 121C and the vibration arm 121D. This generates torsional moments acting about the central axes r1 and r2 in opposite directions, which bends the base portion 130 that extends in the X-axis direction and displaces the base portion 130 in the Z-axis direction. For example, a maximum amplitude of each of the vibration arms 121A to 121D is about 50 μm, and a normal amplitude during a normal operation is about 10 μm.

Figure 6:
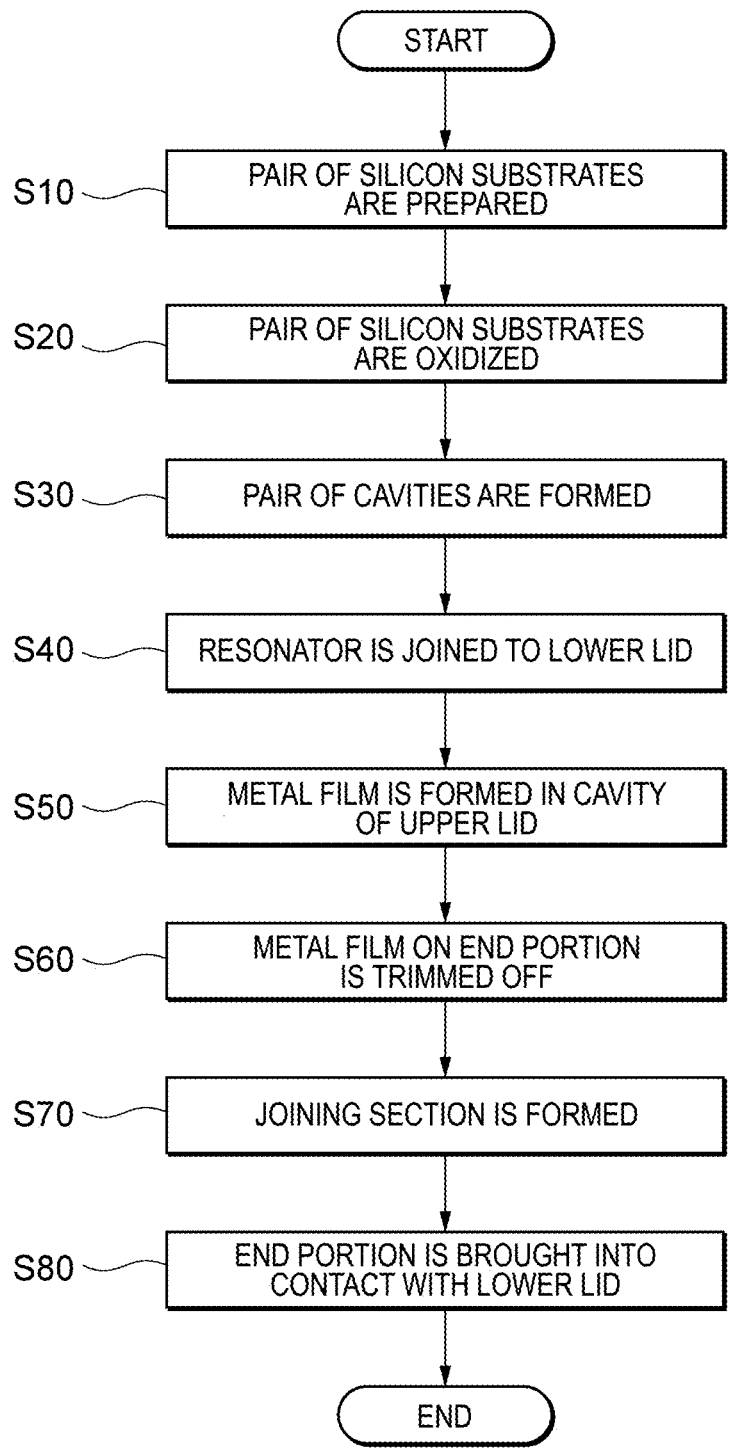
FIG. 6 is a flowchart schematically illustrating a method of manufacturing the resonance device of the exemplary embodiment.
Figure 7:
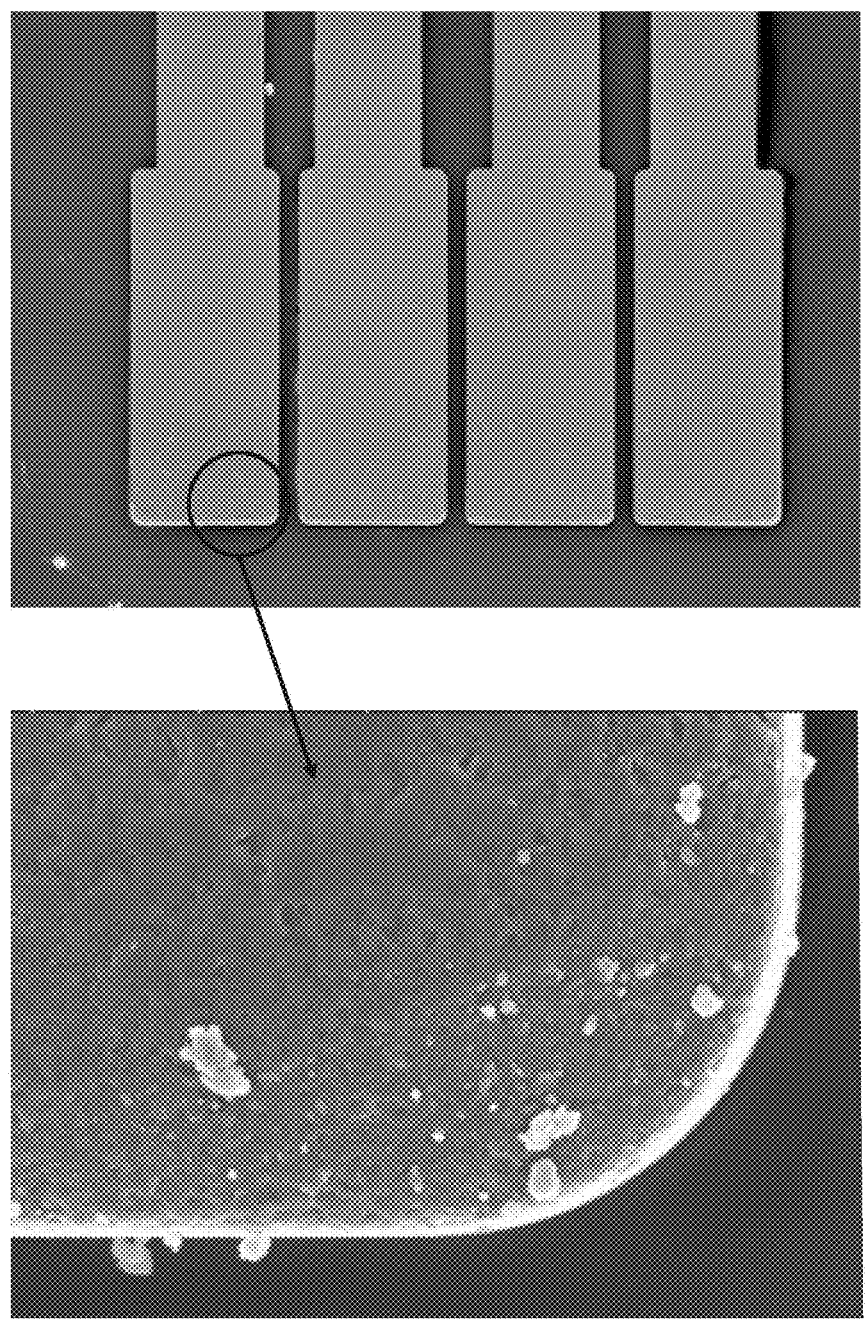
FIG. 7 includes photographs showing end portions of vibration arms that face a lower lid.
Figure 8:
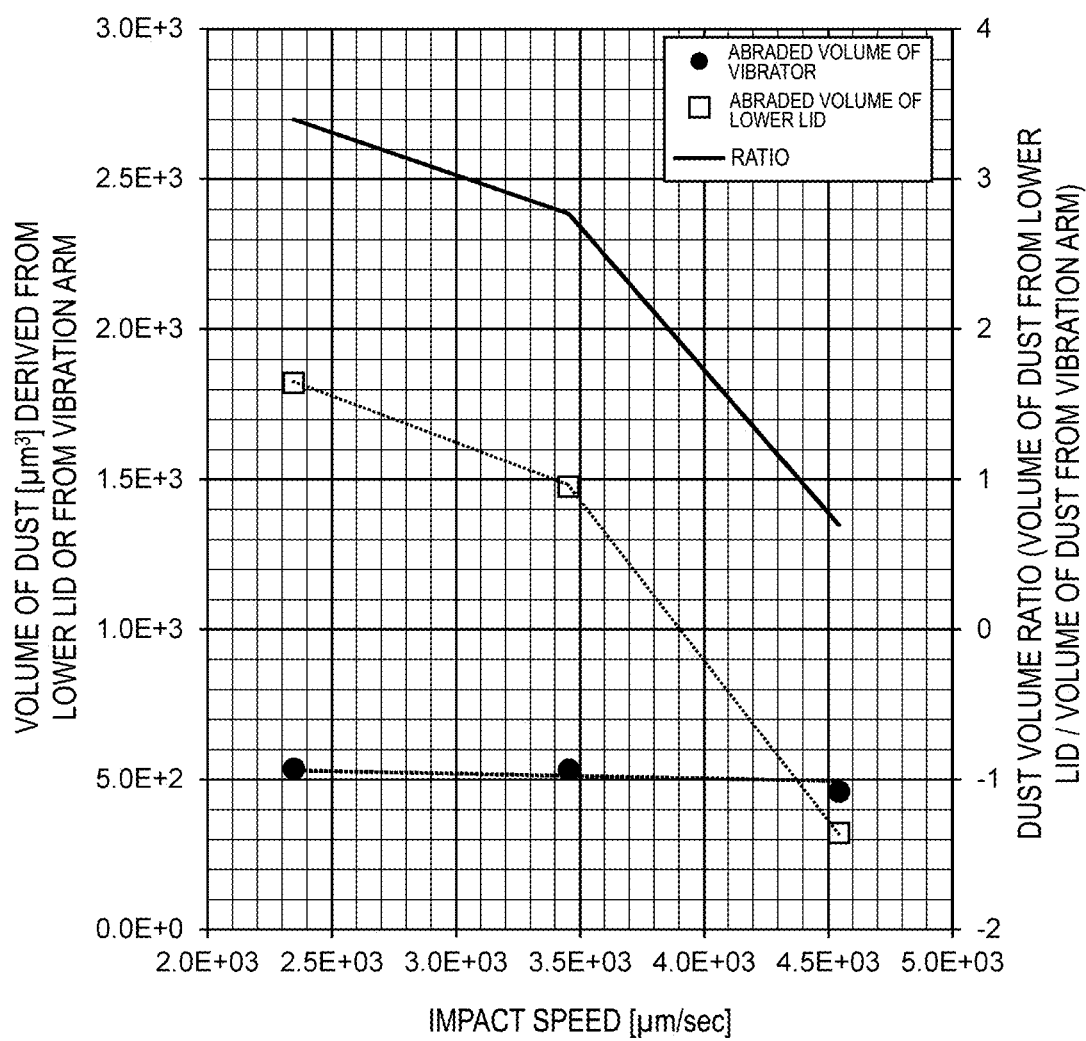
FIG. 8 is a graph depicting change in volume of dust relative to impact speed.
Figure 9:
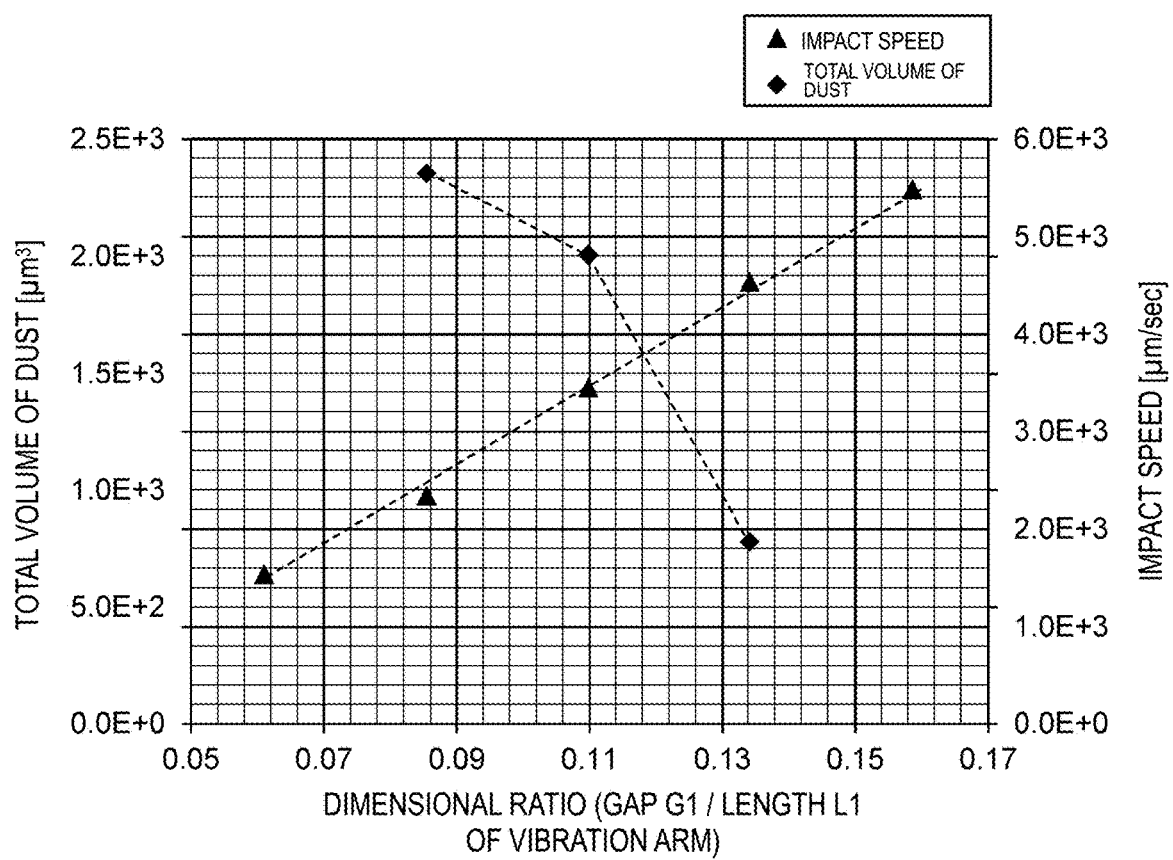
FIG. 9 is a graph depicting change in impact speed and in total volume of dust relative to dimensional ratio.

Next, a method of manufacturing the resonance device 1 of the present embodiment will be described with reference to FIGS. 6 to 9. FIG. 6 is a flowchart schematically illustrating a method of manufacturing the resonance device of the present embodiment. In FIG. 7, photographs show the surface of the end portions of the vibration arms that face the upper lid. FIG. 8 is a graph depicting change in volume of dust relative to impact speed. FIG. 9 is a graph depicting change in impact speed and change in total volume of dust relative to dimensional ratio.

First, a pair of silicon substrates are prepared (S10). The pair of the silicon substrates correspond to the silicon substrate P10 and the silicon substrate Q10 as described above.

Next, the pair of the silicon substrates are oxidized (S20). As a result, the silicon oxide layer Q11 is formed on surfaces of the silicon substrate Q10, and the silicon oxide layer F21 is formed on a surface of the silicon substrate P10. It is noted that only the silicon oxide layer Q11 may be formed in this step, and the silicon oxide layer F21 may be formed in a separate step.

Next, a pair of cavities are formed (S30). The cavity 21 is formed by etching off part of the silicon substrate P10 and part of the silicon oxide layer F21, and the cavity 31 is formed by etching off part of the silicon oxide layer Q11 and part of the silicon substrate Q10. It should be appreciated that the method of forming the cavities 21 and 31 is not limited to the etching. Moreover, the cavity 21 can be formed after the resonator 10 is joined to the lower lid 20.

Next, the resonator is joined to the lower lid (S40). The resonator 10 and the lower lid 20 are heated to a temperature not exceeding their melting points, and the holder frame 140 and the side walls 23 are pressure-bonded together. The method of joining the resonator 10 and the lower lid 20 together is not limited to the above thermocompression bonding. For example, the resonator 10 and the lower lid 20 can be bonded together using a brazing metal, solder, or the like.

Next, a metal film is formed in the cavity of the upper lid (S50). For example, the metal film 70 is formed by depositing titanium vapor on a bottom surface 32B of the silicon substrate Q10. The metal film 70 is patterned using a metal mask. The method of patterning the metal film 70 is not limited to the above patterning using the metal mask but may be etching using photoresist or may be using the lift-off technique.

Next, the metal film on each of the end portions is trimmed off (S60). Part of each of the metal films 125A to 125D is removed by dry etching, in other words, by irradiating the end portions 122A to 122D of the vibration arms 121A to 121D with argon (Ar) ion beams. As a result, the weight of each of the end portions 122A to 122D changes to adjust the frequency. Accordingly, the step S60 corresponds to a frequency adjusting step before sealing (i.e., a first frequency adjusting step). The frequency adjusting step S60 before sealing is efficient in processing the metal films 125A to 125D because a wide region can be irradiated with ion beams. The frequency adjustment can be carried out after sealing in the embodiment of the present invention. Accordingly, the frequency adjusting step S60 before sealing can be omitted in an alternative aspect.

Next, the joining section is formed (S70). The metallized layer of the resonator 10 and the metallized layer of the upper lid 30 are bonded together in a vacuum environment. The joining section H formed in this step seals the interior space in a vacuum state. Accordingly, the present step S70 corresponds to a sealing step. The joining section H is formed by heating. For example, the heating is performed at a temperature of 400° C. or more and 500° C. or less for a duration of one minute or more and 30 minutes or less. Sufficient bonding strength and sealing properties can be obtained when the heating is performed with a temperature of 400° C. or more and a duration of one minute or more. The energy efficiency can be improved and the manufacturing time can be reduced when the heating is performed with a temperature of 500° C. or less and a duration of 30 minutes or less.

It is noted that a step of activating the metal film 70 into a getter film can be carried out before the resonator 10 is joined to the upper lid 30. In the step of activating the metal film 70 into the getter film, hydrogen adhered to the surface of the metal film 70 is detached, for example, by heating to recover the hydrogen adsorption effect of the surface. For example, the heating is performed at a temperature of 350° C. or more and 500° C. or less for a duration of 5 minutes or more and 30 minutes or less. The metal film 70 can be activated adequately when the heating is performed with a temperature of 350° C. or more and a duration of 5 minutes or more. The energy efficiency can be improved and the manufacturing time can be reduced when the heating is performed with a temperature of 500° C. or less and a duration of 30 minutes or less.

Next, the end portions are brought into contact with the lower lid (S80). In operation, a voltage greater than the voltage required for the normal operation is applied to vibrate the resonator 10, thereby causing the edges of the end portions 122A to 122D to strike the bottom plate 22 of the lower lid 20. Due to the end portions 122A to 122D striking the bottom plate 22, the edges of the end portions 122A to 122D are abraded to have an inclined or circular shape as illustrated in FIG. 7. The step S80 corresponds to a frequency adjusting step after sealing (i.e., a second frequency adjusting step). The change in mass of each of the end portions 122A to 122D can be adjusted accurately, for example, by changing the strength of applied voltage. Accordingly, the frequency adjusting step S80 after sealing is excellent in processing accuracy. The frequency, which may change during the sealing step S70, can be fine-tuned in the frequency adjusting step S80 after sealing. The frequency can be adjusted twice using different methods before and after the sealing, which enables efficient and precise frequency adjustment.

In the step S80, part of the silicon oxide layer F21 is abraded from each of the end portions 122A to 122D of the vibration arms 121A to 121D, and part of the silicon substrate P10 is abraded from the lower lid 20. As illustrated in FIG. 7, some dust of silicon oxide derived from the vibration arms 121A to 121D (e.g., dust from vibration arm) and some dust of silicon derived from the lower lid 20 (e.g., dust from lower lid) are adhered to the vibration arms 121A to 121D.

In general, the breaking stress of $SiO_2$, which is 7.8 GPa, is greater than the breaking stress of Si, which is 4.4 GPa. Accordingly, Si is broken up more easily than $SiO_2$. If equivalent external stresses act on the lower lid 20 and on each of the vibration arms 121A to 121D, the dust from lower lid is produced more than the dust from vibration arm. However, when each of the vibration arms 121A to 121D strikes the lower lid 20, the external stress acting on each of the vibration arms 121A to 121D is greater than the external stress acting on the lower lid 20. These external stresses increase as the impact speed increases.

Accordingly, by controlling the impact speed, the breakage of Si of the lower lid 20, which tends to break more easily, can be reduced, while the breakage of $SiO_2$ of the vibration arms 121A to 121D, which tends to break less easily, can be promoted.

Here, desirable conditions for the step S80 are described with reference to the graphs in FIGS. 8 and 9. In FIG. 8, the transverse axis of the graph represents the impact speed (μm/sec) of the vibration arms 121A to 121D against the lower lid 20. The left vertical axis represents the volume of dust ($μm^3$) derived from the lower lid 20 or from the vibration arms 121A to 121D when the vibration arms 121A to 121D strike the lower lid 20. The right vertical axis represents the dust volume ratio obtained by dividing the volume of dust from the lower lid 20 by the volume of dust from the vibration arms 121A to 121D. In FIG. 9, the transverse axis of the graph represents the dimensional ratio obtained by dividing the gap width G1 at the side of lower lid 20 by the length L1 of the vibration arms 121A to 121D in the Y-axis direction. The left vertical axis represents the total volume of dust ($μm^3$), and the right vertical axis represents the impact speed (μm/sec) of the vibration arms 121A to 121D against the lower lid 20.

As illustrated in FIG. 8, when the vibration arms 121A to 121D strike the lower lid 20 until the volume of dust from vibration arm reaches $5.0×10^2$ $μm^3$, the volume of dust from lower lid decreases as the impact speed increases. Especially when the impact speed is $3.5×10^3$ μm/sec or more, the decrease rate of the volume of dust from lower lid with respect to an increase in impact speed becomes greater compared with the decrease rate when the impact speed is less than $3.5×10^3$ μm/sec. In other words, if the impact speed is $3.5×10^3$ μm/sec or more, the total volume of dust in the interior space is reduced efficiently by increasing the impact speed. This operation reduces the likelihood of the frequency fluctuating due to attachment and detachment of the dust to and from the vibration arms 121A to 121D. If the impact speed is $4.5×10^3$ μm/sec or more, the volume of dust from lower lid becomes smaller than the volume of dust from vibration arm, thereby further decreasing the total volume of dust.

It is also noted that as illustrated in FIG. 8, when the impact speed is $3.5×10^3$ μm/sec or more, the dust volume ratio is 2.5 or less. Accordingly, if the volume of dust from lower lid is 2.5 times or less of the volume of dust from vibration arm, the total volume of dust in the interior space can be reduced efficiently by increasing the impact speed. When the impact speed is $4.5×10^3$ μm/sec or more, the dust volume ratio is one or less. Accordingly, if the volume of dust from lower lid is equal to or smaller than the volume of dust from vibration arm, the total volume of dust can be further reduced.

As illustrated in FIG. 9, the impact speed is proportional to the dimensional ratio G1/L1. When the gap width G1 and the length L1 satisfy 0.11<G1/L1, the impact speed becomes $3.5×10^3$ μm/sec or more, and the total volume of dust becomes small. However, the relation between the gap width G1 and the length L1 desirably satisfies G1/L1<0.16 from the point of view of controlling the dimensional increase of the resonance device 1.

It is also noted that the gap width G1 at the side of the lower lid 20 and the gap width G2 at the side of the upper lid 30 satisfy G1<G2 and accordingly the end portions 122A to 122D rarely come into contact with the upper lid 30. This configuration and operation prevents a reduction in the impact speed of the vibration arms 121A to 121D against the lower lid 20 due to the vibration arms 121A to 121D coming into contact with the upper lid 30. It is also noted that even if the end portions 122A to 122D strike the upper lid 30, the metal films 125A to 125D and the metal film 70 are subjected to ductile deformation and thereby absorb the impact, which reduces dust generation. As a result, the total volume of dust hardly increases.

The following summarizes a part of or an entirety of the exemplary embodiment as a supplementary note. Advantageous effects are described simultaneously. In general, it should be appreciated that the present invention is not limited to the supplementary note below.

According to an exemplary aspect, a method of manufacturing a resonance device is provided. The method of manufacturing a resonance device includes preparing a resonance device and adjusting a frequency of the resonator. The resonance device includes a lower lid, an upper lid joined to the lower lid, and a resonator that has a vibration arm configured to vibrate in bending vibration in an interior space formed between the lower lid and the upper lid. The adjusting of the frequency of the resonator further includes vibrating the vibration arm in bending vibration and thereby causing an end portion of the vibration arm to strike the lower lid at an impact speed of $3.5×10^3$ μm/sec or more. The end portion of the vibration arm is made of silicon oxide, and the lower lid is made of silicon.

With this configuration, the total volume of dust in the interior space is reduced efficiently by increasing the impact speed because the rate of decrease in the volume of dust from lower lid becomes greater relative to the rate of increase in the impact speed. This can reduce the likelihood of the frequency fluctuating due to attachment and detachment of the dust to and from the vibration arm.

In the method of manufacturing the resonance device, the impact speed may be $4.5×10^3$ μm/sec or more.

This further reduces the total volume of dust and thereby reduces the fluctuation in the frequency.

In the method of manufacturing the resonance device, a gap width G1 between the end portion of the vibration arm and the lower lid and a length L1 of the vibration arm may satisfy 0.11<G1/L1.

With this configuration, the total volume of dust in the interior space can be reduced efficiently by increasing the impact speed.

In the method of manufacturing the resonance device, the gap width G1 between the end portion of the vibration arm and the lower lid and the length L1 of the vibration arm may satisfy G1/L1<0.16.

With this configuration, the size of the resonance device can also be reduced or maintained.

In the method of manufacturing the resonance device, the gap width G1 between the end portion of the vibration arm and the lower lid and a gap width G2 between the end portion of the vibration arm and the upper lid may satisfy G1<G2.

With this configuration, a reduction in the impact speed of the vibration arm against the lower lid due to the vibration arm coming into contact with the upper lid can be suppressed.

In the method of manufacturing the resonance device, the end portion of the vibration arm may have a metal film on a surface of the end portion that faces the upper lid.

With this configuration, even if the end portion of the vibration arm strikes the upper lid, the metal film of the end portion is subjected to ductile deformation and thereby absorb the impact, which reduces dust generation.

According to another exemplary aspect, a method of manufacturing a resonance device is provided. The method of manufacturing a resonance device includes preparing a resonance device and a adjusting a frequency of the resonator. The resonance device includes a lower lid, an upper lid joined to the lower lid, and a resonator that has a vibration arm configured to vibrate in bending vibration in an interior space formed between the lower lid and the upper lid. The adjusting of the frequency of the resonator further includes vibrating the vibration arm in bending vibration and thereby causing the vibration arm to strike the lower lid so as to produce dust of the lower lid and dust of the vibration arm. A breaking stress of a portion of the lower lid that a portion of the vibration arm strikes is smaller than a breaking stress of the portion of the vibration arm that strikes the portion of the lower lid. In the interior space, a volume of the dust derived from the lower lid is 2.5 times or less of a volume of the dust derived from the vibration arm.

With this configuration, the total volume of dust in the interior space is reduced efficiently by increasing the impact speed because the rate of decrease in the volume of dust from lower lid becomes greater relative to the rate of increase in the impact speed. This configuration and operation reduces the likelihood of the frequency fluctuating due to attachment and detachment of the dust to and from the vibration arm.

According to another exemplary aspect, a resonance device is provided. The resonance device includes a lower lid, an upper lid joined to the lower lid, and a resonator that has a vibration arm configured to vibrate in bending vibration in an interior space formed between the lower lid and the upper lid. In the resonance device, a breaking stress of a portion of the lower lid that a portion of the vibration arm strikes is smaller than a breaking stress of the portion of the vibration arm that strikes the portion of the lower lid. In the interior space, a volume of dust derived from the lower lid is 2.5 times or less of a volume of dust derived from the vibration arm.

With this configuration, the total volume of dust in the interior space is reduced efficiently by increasing the impact speed because the rate of decrease in the volume of dust from lower lid becomes greater relative to the rate of increase in the impact speed. This configuration and operation reduces the likelihood of the frequency fluctuating due to attachment and detachment of the dust to and from the vibration arm.

In the resonance device, the volume of dust derived from the lower lid in the interior space may be equal to or smaller than the volume of dust derived from the vibration arm.

This can further reduce the total volume of dust and thereby reduce the fluctuation in the frequency.

In the resonance device, a portion of the lower lid that a portion of the vibration arm strikes may be made of silicon, and the portion of the vibration arm that strikes the portion of the lower lid may be made of silicon oxide.

In general, it should be appreciated that the resonance device according to the exemplary embodiment can be widely applied to various devices utilizing electromechanical energy conversion based on piezoelectric effect, such as timing devices, sound generators, oscillators, and load sensors.

According to the present invention, as described above, a resonance device that can improve the reliability and a method of manufacturing the resonance device can be provided.

In general, it is noted that the exemplary embodiment described above is intended to facilitate understanding of the present invention and is not intended to limit the scope of the invention. The present invention can be altered or modified without departing from the spirit thereof, and the present invention includes equivalents thereof. In other words, a design change made by those skilled in the art on the basis of the embodiment falls within the scope of the present invention insofar as such a design change incorporates features of the present invention. For example, arrangement, material, condition, shape, size, or the like, of each element included in the embodiment are not limited to what has been described by way of example and can be changed appropriately. In addition, the configurations described in the embodiment can be partially replaced or combined with one another if technically feasible, and such replacement or combination is included within the scope of the present invention insofar as such replacement or combination incorporates features of the present invention.

REFERENCE SIGNS LIST 1 resonance device
10 resonator
20 lower lid
30 upper lid
70 metal film
110 vibrator
140 holder frame
150 holding arm
121A to 121D vibration arm
122A to 122D end portion
123A to 123D arm portion
125A to 125D metal film
G1, G2 gap width
L1 length of vibration arm

The invention claimed is:

1. A method of manufacturing a resonance device, the method comprising:
   preparing a resonance device that includes:
   a lower lid formed of silicon,
   an upper lid joined to the lower lid, and
   a resonator having at least one vibration arm that includes an end formed of silicon oxide and that is configured to vibrate in bending vibration in an interior space formed between the lower lid and the upper lid; and adjusting a frequency of the resonator by vibrating the at least one vibration arm in bending vibration to cause the end of the at least one vibration arm to strike the lower lid at an impact speed of $3.5 \times 10^3$ µm/sec or more.

2. The method of manufacturing the resonance device according to claim 1, wherein the adjusting of the frequency comprises vibrating the at least one vibration arm to cause the end to strike the lower lid at an impact speed of $4.5 \times 10^3$ µm/sec or more.

3. The method of manufacturing the resonance device according to claim 1, wherein preparing the resonance device comprises forming a gap width G1 between the end of the at least one vibration arm and the lower lid and a length L1 of the at least one vibration arm, such that $0.11 < G1/L1$.

4. The method of manufacturing the resonance device according to claim 1, wherein preparing the resonance device comprises forming a gap width G1 between the end of the at least one vibration arm and the lower lid and a length L1 of the at least one vibration arm, such that $G1/L1 < 0.16$.

5. The method of manufacturing the resonance device according to claim 1, wherein preparing the resonance device comprises forming a gap width G1 between the end of the at least one vibration arm and the lower lid and a gap width G2 between the end of the at least one vibration arm and the upper lid, such that $G1 < G2$.

6. The method of manufacturing the resonance device according to claim 1, further comprising forming a metal film on a surface of the end of the at least one vibration arm that faces the upper lid.

7. The method of manufacturing the resonance device according to claim 1, wherein preparing the resonance device comprises forming the resonator to have a base with the at least one vibration arm extending therefrom, and wherein the end of the at least one vibration arm has a width greater than a width of an arm portion that connects the end to the base.

8. The method of manufacturing the resonance device according to claim 7, wherein preparing the resonance device comprises forming the end of the at least one vibration arm to have a substantially rectangular shape with four rounded corners.

9. The method of manufacturing the resonance device according to claim 1, wherein preparing the resonance device comprises forming the resonator, the upper lid and the lower lid of a substrate other than a silicon substrate.

10. The method of manufacturing the resonance device according to claim 1, further comprising forming excitation electrodes on the resonator.

11. The method of manufacturing the resonance device according to claim 10, wherein the adjusting of the frequency of the resonator comprises applying a voltage to the excitation electrodes to cause the bending vibration of the at least one vibration arm.

12. The method of manufacturing the resonance device according to claim 11, wherein the adjusting of the frequency comprises applying the voltage that is greater than a voltage required for normal operation of the resonance device.

13. The method of manufacturing the resonance device according to claim 11, wherein the adjusting of the frequency comprises adjusting the voltage applied to the excitation electrodes to change an amplitude of the bending vibration.

14. The method of manufacturing the resonance device according to claim 6, wherein the adjusting of the frequency comprises trimming a portion of the metal film on the surface of the end of the at least one vibration arm.

15. The method of manufacturing the resonance device according to claim 3, wherein a maximum amplitude of vibration of the at least one vibration arm is equal to the gap width G1.

16. The method of manufacturing the resonance device according to claim 1, wherein the adjusting of the frequency of the resonator comprises abrading the end of the at least one vibration arm to have an inclined or circular shape.

17. A method of manufacturing a resonance device, the method comprising:
preparing a resonance device that includes:
a lower lid,
an upper lid joined to the lower lid, and
a resonator that has at least one vibration arm configured to vibrate in bending vibration in an interior space formed between the lower lid and the upper lid; and
adjusting a frequency of the resonator by vibrating the at least one vibration arm in bending vibration to cause the at least one vibration arm to strike the lower lid so as to produce dust of the lower lid and dust of the at least one vibration arm,
wherein a portion of the lower lid that a portion of the at least one vibration arm strikes has a breaking stress that is lower than a breaking stress of the portion of the at least one vibration arm that strikes the portion of the lower lid, and
wherein, in the interior space, a volume of the dust derived from the lower lid is 2.5 times or less of a volume of the dust derived from the vibration arm.

18. A resonance device comprising:
a lower lid;
an upper lid coupled to the lower lid; and
a resonator that has at least one vibration arm that includes an end and that is configured to vibrate in bending vibration in an interior space between the lower lid and the upper lid,
wherein a portion of the lower lid that the end of the at least one vibration arm strikes during the bending vibration has a breaking stress that is smaller than a breaking stress of the end of the at least one vibration arm, and
wherein, in the interior space, a volume of dust derived from the lower lid is 2.5 times or less than a volume of dust derived from the at least one vibration arm when the end of the at least one vibration arm strikes the lower lid.

19. The resonance device according to claim 18, wherein, in the interior space, the volume of dust derived from the lower lid is equal to or smaller than the volume of dust derived from the at least one vibration arm.

20. The resonance device according to claim 18, wherein:
the portion of the lower lid that the end of the at least one vibration arm strikes is silicon, and
the end of the at least one vibration arm that strikes the portion of the lower lid is silicon oxide.

* * * * *